(12) United States Patent
Kikuchi et al.

(10) Patent No.: US 9,362,717 B2
(45) Date of Patent: Jun. 7, 2016

(54) COLUMNAR CRYSTAL CONTAINING LIGHT EMITTING ELEMENT AND METHOD OF MANUFACTURING THE SAME

(75) Inventors: Akihiko Kikuchi, Tokyo (JP); Katsumi Kishino, Tokyo (JP)

(73) Assignee: SOPHIA SCHOOL CORPORATION, Tokyo (JP)

( * ) Notice: Subject to any disclaimer, the term of this patent is extended or adjusted under 35 U.S.C. 154(b) by 1505 days.

(21) Appl. No.: 11/574,386

(22) PCT Filed: Aug. 30, 2005

(86) PCT No.: PCT/JP2005/015799
§ 371 (c)(1),
(2), (4) Date: Feb. 27, 2007

(87) PCT Pub. No.: WO2006/025407
PCT Pub. Date: Mar. 9, 2006

(65) Prior Publication Data
US 2007/0248132 A1    Oct. 25, 2007

(30) Foreign Application Priority Data
Aug. 31, 2004  (JP) ................... 2004-253267

(51) Int. Cl.
*H01L 33/00*    (2010.01)
*H01S 5/183*    (2006.01)
(Continued)

(52) U.S. Cl.
CPC ............... *H01S 5/183* (2013.01); *B82Y 20/00* (2013.01); *C30B 23/002* (2013.01); *C30B 25/02* (2013.01);
(Continued)

(58) Field of Classification Search
CPC .... B82Y 20/00; C30B 29/403; C30B 29/406; C30B 29/605; H01L 33/007; H01L 33/0075; H01L 33/02; H01L 33/08; H01L 33/16; H01L 33/18
USPC ............ 257/79, 88, 94, 96, 97, 103, E33.001, 257/E33.002, E33.003, E33.005, E33.006, 257/E33.013, E33.025, E33.028, 627
See application file for complete search history.

(56) References Cited

U.S. PATENT DOCUMENTS 5,231,049 A * 7/1993 Neugebauer ........ H01L 25/0753
148/DIG. 45
5,895,932 A * 4/1999 Bojarczuk, Jr. ....... H01L 33/502
257/102
(Continued)

FOREIGN PATENT DOCUMENTS

FR    2 842 832 A1    1/2004
JP    2003-142728 A    5/2003
JP    2003-152220 A    5/2003

OTHER PUBLICATIONS

Kikuchi et al., "InGaN/GaN Multiple Quantum Disk Nanocolumn Light-Emitting Diodes Grown on (111) Si Substrate", Japanese Journal of Applied Physics 43 (2004) pp. L1524-L1526.*
(Continued)

*Primary Examiner* — Jay C Kim
(74) *Attorney, Agent, or Firm* — Sughrue Mion, PLLC

(57) ABSTRACT

A method of manufacturing a semiconductor element by forming, on a substrate, columnar crystals of a nitride-base or an oxide-base compound semiconductor, and by using the columnar crystals, wherein on the surface of the substrate, the columnar crystals are grown while ensuring anisotropy in the direction of c-axis, by controlling ratio of supply of Group-III atoms and nitrogen, or Group-II atoms and oxygen atoms, and temperature of crystal growth, so as to suppress crystal growth in the lateral direction on the surface of the substrate.

5 Claims, 8 Drawing Sheets

(51) Int. Cl.

| | |
|---|---|
| *B82Y 20/00* | (2011.01) |
| *C30B 25/02* | (2006.01) |
| *C30B 29/16* | (2006.01) |
| *C30B 29/40* | (2006.01) |
| *C30B 29/60* | (2006.01) |
| *C30B 23/00* | (2006.01) |
| *H01L 21/02* | (2006.01) |
| *H01L 33/08* | (2010.01) |
| *H01S 5/02* | (2006.01) |
| *H01S 5/04* | (2006.01) |
| *H01S 5/32* | (2006.01) |
| *H01S 5/34* | (2006.01) |
| *H01S 5/343* | (2006.01) |
| *H01L 33/18* | (2010.01) |

(52) U.S. Cl.
CPC .............. *C30B 29/16* (2013.01); *C30B 29/403* (2013.01); *C30B 29/605* (2013.01); *H01L 21/0237* (2013.01); *H01L 21/0242* (2013.01); *H01L 21/0254* (2013.01); *H01L 21/02381* (2013.01); *H01L 21/02458* (2013.01); *H01L 21/02472* (2013.01); *H01L 21/02483* (2013.01); *H01L 21/02505* (2013.01); *H01L 21/02554* (2013.01); *H01L 21/02565* (2013.01); *H01L 21/02603* (2013.01); *H01L 33/007* (2013.01); *H01L 33/0079* (2013.01); *H01L 33/08* (2013.01); *H01L 33/18* (2013.01); *H01S 5/021* (2013.01); *H01S 5/041* (2013.01); *H01S 5/3202* (2013.01); *H01S 5/3412* (2013.01); *H01S 5/34333* (2013.01)

(56) References Cited

U.S. PATENT DOCUMENTS

| | | | | |
|---|---|---|---|---|
| 6,404,125 | B1* | 6/2002 | Garbuzov | H01L 33/502 257/E33.068 |
| 6,410,940 | B1* | 6/2002 | Jiang | B82Y 20/00 257/79 |
| 6,806,115 | B2 | 10/2004 | Koide et al. | |
| 6,995,030 | B2* | 2/2006 | Illek et al. | 438/29 |
| 8,163,575 | B2* | 4/2012 | Wierer et al. | 438/22 |
| 2003/0087462 | A1 | 5/2003 | Koide et al. | |
| 2005/0194598 | A1* | 9/2005 | Kim et al. | 257/79 |
| 2006/0099781 | A1 | 5/2006 | Beaumont et al. | |
| 2006/0208273 | A1* | 9/2006 | Kang | H01L 33/08 257/103 |

OTHER PUBLICATIONS

Akira Sakai, et al., Defect structure in selectively grown GaN films with low threading dislocation density, Appl. Phys. Lett. 71 (16) Oct. 20, 1997.

Kusakabe, K. et al., Characterization of Overgrown GaN Layers on Nano-Columns Grown by RF-Molecular Beam Epitaxy, Jpn.J.Appl. Phys, Part 2, vol. 40, No. 3A, 2001, pp. L192 to L194.

Yoshizawa, M. et al., Growth of Self-Organized GaN Nanostructures on $Al_2O_3(0001)$ by RF-Radial Source Molecular Beam Epitaxy, Jpn. J.Appl.Phys. Part 2, vol. 36, No. 4B, 1997, pp. L459 to L462.

Luo Z.S. et al., Enhancement of (In, Ga) N Light-Emitting Diode Performance by Laser Liftoff and Transfer From Sapphire to Silicon, IEEE Photonics Technology Letters, vol. 14, No. 10, 2002, pp. 1400 to 1402.

Akira Usui, et al., Thick GaN Epitaxial Growth with Low Dislocation Density by Hybride Vapor Phase Epitaxy, Japanese J, Phys. vol. 36 (1997) pp. L899-L902, Part 2, No. 7B, Jul. 15, 1997.

Kawai et al., "RF-MBE-ho ni yoru InN no Kessho Seicho to Nano Kozo no Sakusei", The Institute of Electronics, Information and Communication Engineers Gijutsu Kenkyu Hokoku, vol. 13, No. 343 (CPM2003 102-116), 2003, pp. 33 to 37.

K. Kusakabe, "Overgrowth of GaN layer on GaN nano-columns by RF-molecular beam epitaxy", Journal of Crystal Growth, Amsterdam. vol. 237-239, Apr. 2002, pp. 988-992.

K. Hiramatsu, "Fabrication and characterization of low defect density GaN using facet-controlled epitaxial lateral overgrowth (FACELO)", Journal of Crystal Growth, Amsterdam, vol. 221, No. 1-4, Dec. 2000, pp. 316-326.

Kim et al., "High-Brightness Light Emitting Diodes Using Dislocation-Free Indium Gallium Nitride/Gallium Nitride Multiquantum-Well Nanorod Arrays", Nano Letters, American Chemical Society, 2004, vol. 4, No. 6, pp. 1059-1062.

Kim et al., "Nanoscale Ultraviolet-Light-Emitting Diodes Using Wide-Bandgap Gallium Nitride Nanorods", Advanced Materials, 2003, vol. 15, No. 7-8, pp. 567-569.

Kim et al., "Growth of GaN Nanorods by a Hydride Vapor Phase Epitaxy Method", Advanced Materials, 2002, vol. 14, No. 13-14, pp. 991-993.

Communication dated Sep. 18, 2015, issued by the European Patent Office in corresponding European Application No. 05 777 119.8.

* cited by examiner

COLUMNAR CRYSTAL CONTAINING LIGHT EMITTING ELEMENT AND METHOD OF MANUFACTURING THE SAME

TECHNICAL FIELD

The present invention relates to a semiconductor element of semiconductor devices, such as diode, light emitting diode and semiconductor laser, which is obtained by allowing a nitride-base or oxide-base compound semiconductor layer to grow according to a predetermined density in a form of uniform columnar crystals, and by using thus-grown columnar crystals, and a method of manufacturing the same.

This application is to claim a right of priority over Japanese Patent Application No. 2004-253267 filed on 31 Aug., 2004, the content of which is incorporated hereinto by reference.

BACKGROUND ART

Nitride-base compound semiconductors are known to show direct transition over the entire compositional region thereof (for example, AlN, GaN, InN and mixed crystals thereof), have wide band gaps, and are known as materials for blue or violet light emitting diode, in other words, materials for short-wavelength light emitting elements.

The nitride-base compound semiconductors, however, have crystal structures of the hexagonal system, for which there is no lattice-matched substrate crystal unlike the conventional Group III-V compound semiconductors. Therefore, they are generally grown on the surface of sapphire substrate (SiC or Si is also adoptable) having the hexagonal structure.

However, since crystal lattice of the (0001) surface of the sapphire substrate and that of the (0001) surface of the nitride-base compound semiconductor differ in the lattice constants, there is lattice mismatch between them. Thus, growth of the nitride-base compound semiconductor layer onto the sapphire substrate results in an insufficient crystallinity as a continuous thin film, and fails in obtaining an epitaxial film having a low threading dislocation density.

Presence of a high density of such threading dislocation results in degradation in light emitting characteristics, when the nitride-base compound semiconductor is used as a material for high-luminance light emitting diodes and semiconductor lasers.

For this reason, a GaN thin film having a predetermined thickness is grown on the sapphire substrate, and thereafter a stripe-patterned or a mesh-patterned mask composed of a thin film of $SiO_2$, SiN or metal is formed. Thereafter, re-growth of GaN under specific conditions can allow GaN to grow only on the exposed GaN portions, without causing crystal growth on the mask.

In this process, on the mask, GaN grows laterally and fuses on the top surface of the mask, so that the entire surface can be covered with GaN, and finally a flat continuous thin film of GaN can be produced (see Non-Patent Documents 1 and 2).

The threading dislocation density can be largely reduced in the GaN continuous thin film epitaxially grown laterally on the mask, when compared to in GaN continuous thin films formed by the general manufacturing methods.

As a technique similar to as described in the above, there has been also proposed a technique of reducing the threading dislocation, by forming steps on the sapphire substrate or the GaN film so as to allow the lateral growth.

[Non-Patent Document 1] A. Usui, H. Sunakawa, A. Sakai and A. Yamaguchi, "Thick GaN epitaxial growth with low dislocation density by hydride vapor phase epitaxy", Jpn. J. Appl. Phys., 36 (7B) 1997.

[Non-Patent Document 2] A. Sakai, H. Sunakawa and A. Usui, "Defect structure in selectively grown GaN films with low threading dislocation density", Appl. Phys. Lett., 71 (16) 1997

DISCLOSURE OF THE INVENTION

Problems to be Solved by the Invention

The general MOCVD (metal-organic chemical vapor deposition) process would result in a threading dislocation density of $10^9/cm^2$ in the GaN film grown on the sapphire substrate, while the threading dislocation density in the above-described, Non-Patent Documents 1 and 2 can be reduced to as low as $10^6/cm^2$ or around, by employing the lateral epitaxial growth.

The methods of growth shown in Non-Patent Documents 1 and 2, however, suffer from complicated processes of manufacturing, need larger numbers of process steps, and consequently need larger costs as compared with the general method of growth.

As a consequence, commercially-available, low-dislocation-density GaN wafer is a material that is extremely expensive as one million yen or around per a single 2-inch wafer.

There has been also reported GaN with an extremely low dislocation density grown by the high-pressure synthetic process using sodium or the like as a solvent in a research phase, but is almost not commercially available because of difficulty in a real expansion due to limitation in manufacturing processes.

In addition, for the case where the columnar crystals are intended for use as light emitting elements, a trial of forming electrodes on the upper portions of the columnar crystals by the conventional method of forming a light emitting element undesirably allows the electrode material to come around the side faces of the columnar crystals, causing short-circuiting of semiconductor layers disposed in the vertical direction of the columnar crystals, and connection failure of the electrode between the adjacent columnar crystals, and makes it difficult to form a large-area light emitting element having a diameter of as large as several micrometers or above containing the columnar crystals.

The present invention was conceived after considering the above-described situations, and objects thereof reside in providing a method of manufacturing semiconductor element, such as GaN columnar crystals, having a low threading dislocation density at low costs based on simple manufacturing processes, and in providing a semiconductor element such as a high-luminance light emitting element or a functional element, using the GaN columnar crystals prepared by this method of manufacturing.

Means for Solving the Problems

A method of manufacturing a semiconductor element of the present invention is a method of manufacturing a light emitting element by forming, on a substrate (for example, on a substrate having a predetermined crystal surface directed to the top surface thereof), columnar crystals of a nitride-base or an oxide-base compound semiconductor, by the molecular beam epitaxy (MBE) process, or under different conditions by the MOCVD (metal-organic vapor phase deposition) process, the HVPE (hydride vapor phase epitaxy) process, sputtering or the like, and by using thus-formed columnar crystals. In the method, on the surface of the substrate, the columnar crystals are grown while ensuring anisotropy in the direction of c-axis, by controlling ratio of supply of Group-III atoms and nitrogen, or Group-II atoms and oxygen atoms (in other words, Group-III source and Group-V source, or Group-II source and Group-VT source), and by controlling temperature of crystal growth, so as to suppress crystal growth in the lateral direction on the surface of the substrate. That is, by adjusting the growth temperature and the ratio of supply of Group-III atom and nitrogen so as to adopt them to conditions expressed by region B in FIG. 2, expressed by a range of crystal growth temperature from 750° C. to 950° C., and by a range of ratio of supply of Group-III atom and nitrogen from 1:2 to 1:100, and for example by adjusting the crystal growth temperature within the range from 750° C. to 950° C., and by adjusting the ratio of supply of Group-III atom and nitrogen atom to 1:2 or above, so as to suppress the crystal growth in the lateral direction, the columnar crystals are grown keeping anisotropy in the direction of c-axis.

In other words, the crystal growth temperature is set higher than 700° C. which has generally been adopted, while keeping a nitrogen-excessive condition, so as to suppress the crystal growth in the lateral direction (direction normal to the c-axis along which the side walls of the columnar crystals lie), and thereby to allow the columnar crystals to grow having anisotropy in the direction of c-axis.

In addition, the method of manufacturing a semiconductor element of the present invention is such as forming, on a substrate, columnar crystals of a nitride-base or an oxide-base compound semiconductor, and using thus-formed columnar crystals, wherein on the surface of the substrate, the columnar crystals are grown while ensuring anisotropy in the direction of c-axis, by controlling ratio of supply of a Group-III source and a Group-V source, or a Group-II source and a Group-VI source, and temperature of crystal growth, so as to suppress crystal growth in the lateral direction on the surface of the substrate.

The sources used herein for forming the columnar crystals are not necessarily in a form of atom, but may be supplied in a form of molecule, or in a gas form of, for example, organic Ga compound (Ga) and ammonia (N).

The method of manufacturing a semiconductor element of the present invention is such as adjusting the ratio of supply of the Group-III source and the Group-V source, or the Group-II source and the Group-VT source, and the temperature of crystal growth, with respect to the mode of allowing growth of the columnar crystals while ensuring anisotropy, at the point of time where the columnar crystals reach a predetermined level of height, so as to allow the columnar crystals to grow not only in the longitudinal direction thereof but also isotropically.

In other words, the above-described method of manufacturing is such as sequentially adjusting conditions for growth, allowing not only anisotropic growth only in the longitudinal direction (direction of the c-axis), but allowing also isotropic growth in the crystal direction normal to the c-axis, so as to make the mode of growth transit from the anisotropic growth into the isotropic growth.

For example, the method of manufacturing a light emitting element of the present invention is such as adjusting, at the point of time where the columnar crystals reach a predetermined level of height, the ratio of supply of the Group-III atom and nitrogen atom and the crystal growth temperature, in the mode of allowing growth of the columnar crystals while ensuring anisotropy, that is, by adjusting the growth temperature and the ratio of supply of Group-III atom and nitrogen so as to adopt them to conditions expressed by region C in FIG. 2, expressed by a range of crystal growth temperature from 500° C. to 800° C., and by a range of ratio of supply of Group-III atom and nitrogen from 1:2 to 1:100, allowing the crystal to grow not only in the direction of the c-axis, but also in the direction normal to the c-axis, so as to make the top portions of the columnar crystals in a form of reverse pyramid such as reverse cone or reverse polygonal pyramid, on which a crystal is grown as a continuous film of a nitrogen-base compound semiconductor.

The method of manufacturing a semiconductor element of the present invention is such as forming, at the time of starting the growth of the columnar crystals, dots which serve as nuclei for allowing the columnar crystals to grow on the surface of the substrate (which are growth nuclei, efficient when the columnar crystals are grown on the Si substrate and on the sapphire substrate by the MBE process), according to a predetermined size and to a predetermined distribution density.

The method of manufacturing a semiconductor element of the present invention is such as separating the columnar crystals from the substrate, and bonding them to another substrate.

The method of manufacturing a semiconductor element of the present invention is such as filling the gaps between adjacent columnar crystals with an insulating material.

The insulating material herein may be an inorganic material or an organic material, including dielectrics, and any of those capable of forming a capacitor together with the semiconductor layers placed thereon and thereunder.

A semiconductor element of the present invention is such as having a substrate; columnar crystals arranged on the substrate according to a predetermined density, and in which a device structure having optical or electronic functions (a region formed as an active region expressing functionality such as controlling light emission or direction of current flow) is formed; and a two-dimensionally continuous film layer formed over the columnar crystals (a continuous thin film, effectively applicable as an electrode by virtue of its continuous formation with respect to the lower columnar crystals).

The semiconductor element of the present invention is such that each of the columnar crystals has, as being provided therein at a predetermined level of height, as the above-described device structure, a functional portion (a region formed as an active region expressing functionality such as controlling light emission or direction of current flow) composed of a semiconductor layer differed in the constituent material from the columnar crystals. The functional portion includes, for example, light emitting region or a region having a rectifying function and the like.

The semiconductor element of the present invention is such as having, between the upper portions of the columnar crystals and the film layer, a semiconductor layer composed of the same material with the columnar crystals, gradually enlarging from the diameter of the columnar crystals, in the direction of c-axis.

The semiconductor element of the present invention is such as having a filling component composed of a dielectric material between adjacent columnar crystals.

The present invention allows growth of a layer of reverse truncated pyramids as being continued from the columnar crystals, as visually observable in the scanning electron micrograph of FIG. 12, so as to finally form a continuous thin film by the top portions of the reverse truncated pyramids. In the columnar crystal growth mode (region B: substrate temperatures from 750° C. to 950° C., ratios of supply of Group-V/III from 1:2 to 1:100) and in the reverse truncated pyramid growth mode (region C: substrate temperatures from 500° C. to 800° C., and ratios of supply of Group-V/III from 1:2 to 1:100), and within the conditional ranges for the individual growth modes shown in FIG. 2, the ratio of supply of nitrogen in the reverse truncated pyramid growth mode is adjusted to be lower than that in the columnar crystal growth mode for the case where the growth temperature was set equal for both modes, whereas the growth temperature in the reverse truncated pyramid growth mode is adjusted to be lower than that in the columnar crystal growth mode for the case where the ratio of supply of nitrogen was set equal for both modes, or conditions for the reverse truncated pyramid growth mode is kept within region C, through lowering the substrate temperature, and elevation in the ratio of supply of nitrogen, as compared with those in the columnar crystal growth mode.

The ratio of supply of Group-V (nitrogen) in Group-V/III, in the process of growing the semiconductor layer composed of the reverse truncated pyramids in region C of the present invention, is elevated, aiming at preventing Ga from being excessively supplied to the surface normal to the c-axis of the columnar crystals, in order to make metal Ga less likely to deposit between the adjacent columnar crystals.

Effect of the Invention

As has been explained in the above, according to the present invention, the columnar crystals composed of nitride-base compound semiconductor (GaN, for example) are formed, and the light emitting portion is provided to each of the columnar crystals, thereby making it possible to obtain semiconductor devices (semiconductor elements) such as light emitting element, showing a high luminance in short-wavelength emission regions, by virtue of characteristics of a high-quality columnar crystals almost free from the threading dislocation density.

According to the present invention, crystal conditions of the columnar crystals are altered after a predetermined level of height was reached, so as to switch the growth of the columnar crystals from anisotropic growth to isotropic growth, thereby allowing the upper portions thereof to grow into a geometry of reverse truncated cone or reverse truncated pyramid, and allowing the top portions of the reverse truncated cones or reverse truncated pyramids (generally referred to as reverse truncated pyramids) to come into contact, so as to finally give the upper portions of the columnar crystals as a continuous thin film, to thereby prevent the electrode materials from coming around the side faces of the columnar crystals, making it easy to form the electrodes in the manufacturing process of the light emitting element.

According to the present invention, nuclei from which the columnar crystals are grown are initially formed on the surface of the substrate at predetermined intervals, and the columnar crystals are grown from these nuclei under predetermined conditions, so that the columnar crystals destined for formation of the light emitting portions can readily be produced on the surface of the substrate at predetermined intervals. According to the present invention, it is possible to form semiconductor devices such as light emitting elements having high-luminance characteristics at low costs.

BRIEF DESCRIPTION OF THE INVENTION

EXPLANATION OF THE MARKS

1 . . . substrate, 2 . . . columnar crystal, 2a . . . reverse truncated cone portion (p-type cladding layer), 2b, 2d . . . i-type blocking layer, 2c . . . light emitting layer, 2e . . . cladding layer (n-type cladding layer), 3 . . . electrode layer

BEST MODES FOR CARRYING OUT THE INVENTION

Structure of Light Emitting Element

Figure 1:
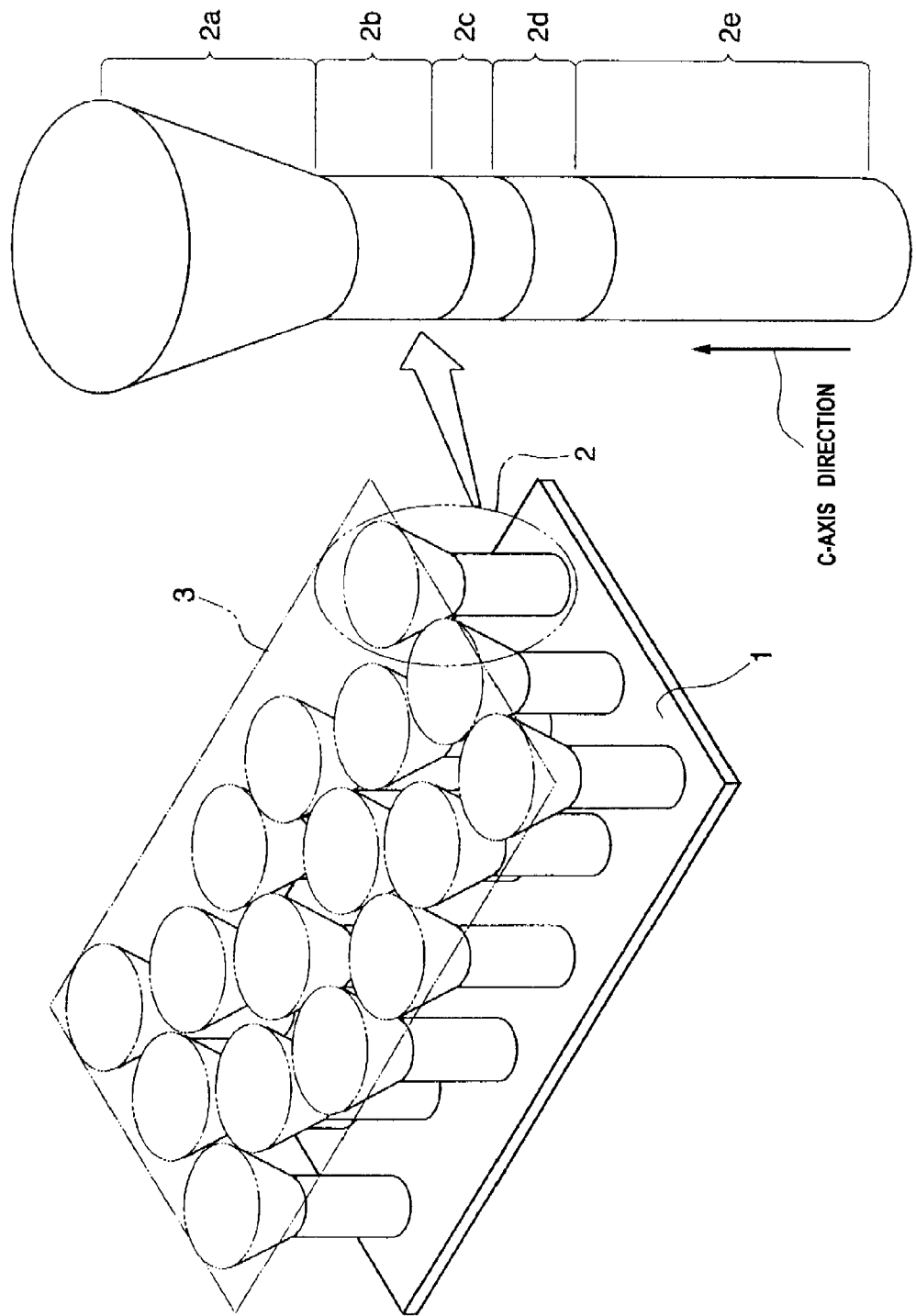
FIG. 1 is a conceptual drawing showing a structure of a light emitting diode according to one embodiment of the present invention.

Paragraphs below will explain a structure of the light emitting element (light emitting diode, for example) according to one embodiment of the present invention referring to the attached drawings. FIG. 1 is a block diagram showing a structure of the light emitting element according to this embodiment.

As seen in this drawing, a light emitting element L has columnar crystals 2 formed on the top surface of a substrate 1, wherein the upper portion of the columnar crystals 2 are electrically connected to an electrode layer 3.

Each of the columnar crystals 2 has, as a device structure, as shown by the enlarged view on the right hand side in FIG. 1, a reverse pyramid (reverse cone or reverse polygonal pyramid) portion 2a (p-type cladding layer), an i-type blocking layer 2b, a light emitting layer 2c, an i-type blocking layer 2d, and an n-type cladding layer 2e.

The columnar crystal 2 has such device structure as described in the above, containing the light emitting layer 2c as a region (portion) of the device structure showing a light emitting function.

The reverse pyramid portion 2a herein is typically composed of p-GaN:Mg (GaN containing Mg as an impurity, thereby showing p-type conductivity) or p-AlGaN:Mg, the i-type blocking layers 2b and 2d are composed of intrinsic GaN, the n-type cladding layer 2e is composed of n-GaN:Si (GaN containing Si as an impurity, thereby showing n-type conductivity) or n-AlGaN:Si, and the light emitting layer 2c has a MQW (multiple quantum well) structure (or SQW: single quantum well) composed of InGaN/GaN (or $In_xGa_{1-x}N/In_yGa_{1-y}N$) or GaN/AlGaN, $Al_xG_{1-x}N/Al_yG_{1-y}N$.

The i-type blocking layer 2b and the i-type blocking layer 2d are provided for the purpose of preventing diffusion of impurities from the reverse pyramid portion 2a and the n-type cladding layer 2e, respectively, to the light emitting layer 2c. However, they are not essential, and structures having the individual cladding layers directly bonded to the light emitting layer 2c may be employed.

Figure 2:
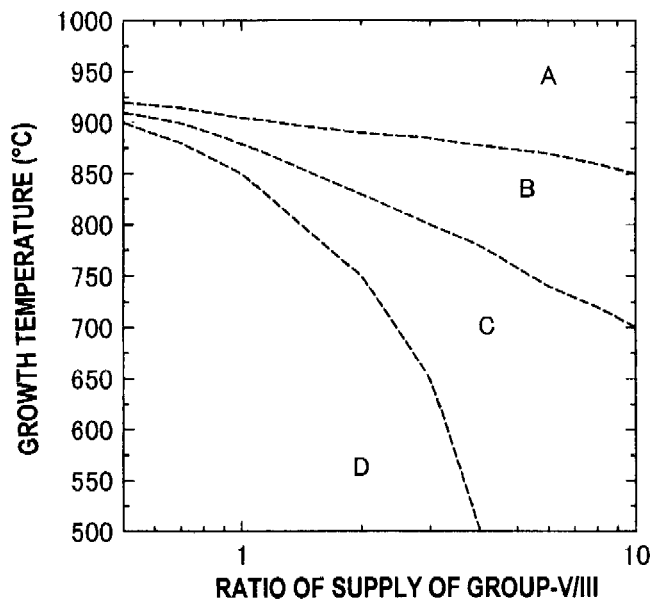
FIG. 2 is a graph explaining growth conditions determined by substrate temperature (growth temperature) and Group-V/III supply ratio.

For example, the substrate 1 is composed of an electro-conductive silicon (or silicon carbide substrate, metal substrate, or sapphire substrate having an electro-conductive finish), wherein on the (111) surface of such silicon substrate, or on the (0001) surface of silicon carbide or sapphire substrate, a hexagonal nitride-base semiconductor is grown in the direction of c-axis (as shown in FIG. 2, in the direction normal to the substrate plane, that is, in the axial direction of the columnar crystals to be grown) as the above-described columnar crystals 2.

Epitaxial growth of a nitride-base compound semiconductor having a hexagonal structure on the surface of a substrate having different lattice constants generally results in a high level of threading dislocation density due to difference in the lattice constants.

This is because the atomic arrangements of the growth nuclei slightly differ from each other, when the growth nuclei formed with a high density in the early stage of growth of the columnar crystals come into contact to form the continuous film.

However, by forming the columnar crystals as described in the above, each of the columnar crystals can grow from a single growth nucleus (seed), and contains almost no threading dislocation. Since the columnar crystals contain no junction portions between the adjacent nano-crystals causative of the threading dislocation, it is possible to drastically lower the threading dislocation density in the whole crystal.

Moreover, reduction in the sectional area of the growth plane is also successful in suppressing distortion stress at the interface to a low level, in suppressing occurrence of the threading dislocation on the columnar crystal basis to a low level, and in lowering the threading dislocation density in the crystal.

Silicon is electro-conductive and inexpensive, but largely differs from nitride-base compound semiconductor in the lattice constants. Thus, any trial of growth of nitride-base compound semiconductor on this substrate often results in crack generation and a high level of treading density. This has promoted a general use of sapphire substrate showing no electro-conductivity. The present invention, however, made it possible to form the nitride-base compound semiconductor on the silicon substrate as described in the above, and thereby to improve efficiency of fabrication on the device basis.

It is also allowable to use, as the substrate, a film surface of GaN having a form of continuous film without causing lattice mismatching, or other semiconductor elements, glass, metal (Al, Ti, Fe, Ni, Cu, Me, Pd, Ag, Ta, W, Pt, Au, or alloys partially containing these elements). On these film surfaces, the growth nuclei are formed in the early stage, and the columnar crystals grow according to a predetermined density (the number of columnar crystals per unit area).

The columnar crystals 2 in the present invention has a structural feature in that they are formed according to a predetermined density, while at least keeping a distance with other columnar crystals, while not necessarily keeping a predetermined distance, that is not composed of unified intervals. This structural feature prevents the columnar crystals 2 from fusing in the process of growth with other columnar crystals formed as being buried, and from forming the continuous film.

Although some portions of the columnar crystals may physically come into contact with each other, rather than keeping complete uncontactness among them as described in the above, it is essential to keep a state in which the adjacent columnar crystals are not bound on the atomic basis. Formation of any bond on the atomic basis may result in production of crystal defects at the bonded surface.

There has been known, as a prior art, a method of forming GaN columnar crystals on the sapphire substrate, and then forming a continuous thin film on the columnar crystals (K. Kusakabe, Jpn. J. Appl. Phys., 40, 2001, L192-L194). The method of fabrication according to the prior art has, however, been suffering from a problem in that Ga, which is a source material, deposits between the adjacent columnar crystals, so that electric isolation between the adjacent columnar crystals cannot be ensured.

Whereas the method of forming the columnar crystals of the present invention can satisfy electric isolation between the adjacent columnar crystals, without allowing a part of the material to deposit between the adjacent columnar crystals as described in the above.

The columnar crystals 2 of the present invention are depicted by the structural features such as being grown up to a predetermined level of height in the direction of c-axis while keeping anisotropy under control of the growth conditions (detailed later in the paragraphs for the method of manufacturing), then being grown isotropically from the p-type cladding layer (including growth not only in the direction of c-axis, but also in directions normal to the c-axis), so as to form the p-type cladding layer as the reverse pyramid portion 2a. Consequently, a continuous thin film is grown as an electrode layer 3.

The geometry of the reverse pyramid portion herein includes not only a geometry depicted by reverse cone or reverse pyramid having side faces thereof continuously widened, but also structures having diameters which change stepwisely, or such like steps, from the columnar crystals as the growth proceeds in the direction of c-axis.

It is still also allowable, without being limited to the reverse pyramid geometry, to adopt a structure finally obtained as a continuous thin film, after being grown so as to widen the surface area of the top growth plane, as the growth proceeds in the direction of c-axis.

As a consequence, the columnar crystals of the present invention, more specifically the top portions of the individual reverse pyramid portions 2a of the columnar crystals 2 formed on the substrate 1, are electrically connected by the electrode layer 3, so that electrical connection with portions other than the reverse pyramid portions 2 is more readily avoidable as compared with the prior arts, and thereby the element characteristics can be improved while simplifying process steps of fabricating semiconductor elements.

<Method of Manufacturing Light Emitting Element; on Silicon Substrate>

Figure 4:
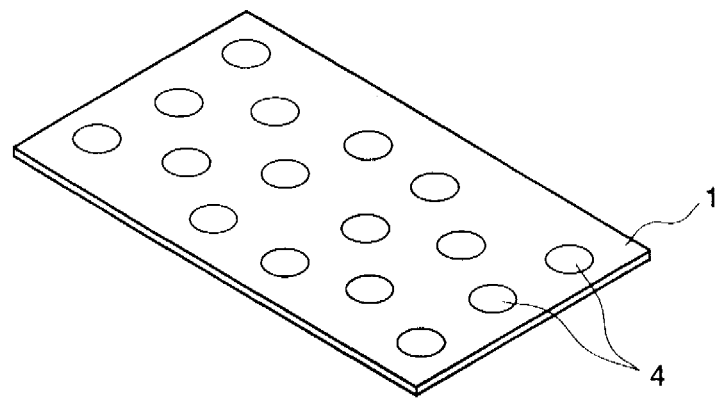
FIG. 4 is a conceptual drawing explaining a method of manufacturing a light emitting element.

For the case where a 350-μm-thick, Sb-doped, low resistivity n-type silicon substrate (on the Si(111) surface) is used as the substrate 1 for forming a light emitting diode having a structure shown in FIG. 1, a manufacturing apparatus adopted herein is an MBE (molecular beam epitaxy) apparatus shown in FIG. 4.

In this case, Ti for heat absorption is deposited on the back surface (surface not destined for growth thereon of the columnar crystals) typically by electron beam deposition, prior to growth of the columnar crystals.

Degree of vacuum in the chamber is adjusted to $10^{-6}$ to $10^{-9}$ Pa (pascal) under a condition having no emission of molecular beams of the individual material (for example, metals such as In, Ga, Mg, Si and so forth, and activated nitrogen) from the individual molecular beam irradiation cells, and to $10^{-2}$ to $10^{-6}$ Pa under a condition having emission of molecular beams and nitrogen for crystal growth from the individual molecular beam irradiation cells.

As the pretreatment, for the purpose of lowering resistivity value of the bonding portion of n-type cladding layer 2e and the substrate 1, and of making the resistivity values of the connection portions of the individual columnar crystals uniform, the surface of Si is washed by the RCA cleaning or by using hydrofluoric acid so as to remove native oxide film on the surface of the Si substrate, to thereby activate the surface.

Substrate temperatures described hereinafter are those of the Ti film deposited on the back surface of the silicon substrate, measured using an infrared radiation thermometer (on the basis of a radiation coefficient of 0.37).

Molecular beam intensity was successively measured using a nude ion gauge moved to the site of measurement of the substrate every time the measurement takes place.

Dopant concentration (electron and hole concentrations) were estimated by the CV method, or based on doping conditions of a single-layered film.

Thickness of the individual electrodes was measured in situ during the deposition process using a quartz oscillator thickness gauge.

Step S1:

Ga is irradiated at a substrate temperature of 500° C. to 600° C., and a degree of vacuum of $10^{-3}$ Pa to $10^{-6}$ Pa.

The Ga irradiation is stopped, and activated nitrogen is then irradiated to form GaN dots, so as to allow growth of the columnar crystals in the succeeding process steps using these GaN dots as the nuclei for the growth.

It is to be noted that Step S1 is omissible if the condition is any of those fall in range B described later.

FIG. 2 herein expresses ranges of growth conditions, in correlation of the substrate temperature (ordinate: growth temperature) and supply ratio of Group-V/III (abscissa).

In the correlation between the growth temperature and the supply ratio of Group-V/III, a range expressed by region A is a range not causative of the crystal growth due to decomposition of GaN, a range expressed by region B is a range satisfying conditions for a growth mode of the columnar crystals, a range expressed by region C is a range satisfying conditions for a growth mode of the columnar crystals so as to grow the upper portions thereof in a form of reverse truncated pyramid, consequently allowing crystals composing a continuous thin film to grow, and region D expresses a growth mode promoting, similarly to as in region C, growth of the reverse truncated pyramid up to the continuous film, while allowing filling of metal Ga between adjacent columnar crystals.

Accordingly, the succeeding growth of the columnar crystals from Step S2 to Step S5 adopts the conditions for region B, and the growth of the reverse truncated pyramid in Step S6 adopts the conditions for region C.

Step S2:

Next, the substrate temperature is adjusted to 860° C. to 880° C. (region B: 750° C. to 950° C.), under a degree of vacuum of $10^{-3}$ Pa to $10^{-6}$ Pa, a ratio of supply of Ga and N of 1:2 (nitrogen: 1, Ga: 0.5, region B: from 1:2 to 1:100), an intensity of Ga molecular beam of $6 \times 10^{-4}$ Pa, and under excessive supply of N, the n-type cladding layer 2e of 100 nm to 2,000 nm in height, for example, 750 nm in height (thickness), is grown as the GaN:Si columnar crystals, using the GaN dots as the growth nuclei. In this process, Si atoms as n-type impurity atoms are supplied so as to attain n (electron concentration)=$1 \times 10^{15}/cm^3$ to $1 \times 10^{21}/cm^3$, at room temperature.

In short, it is to be understood that the columnar crystals can be formed by allowing the growth to proceed on the surface of the sapphire substrate, at a temperature higher than the substrate temperature generally adopted for growth of GaN (700° C.), under a condition expressed by the ratio of supply of Group-III atom and nitrogen atom of 2 or above.

Figure 5:
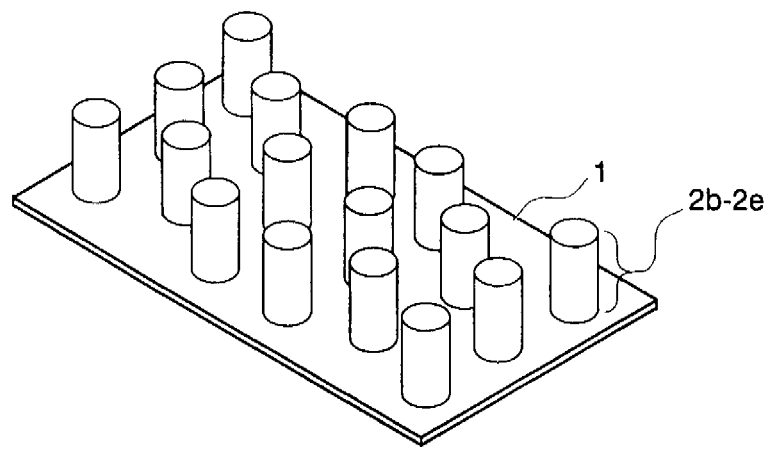
FIG. 5 is a conceptual drawing explaining the method of manufacturing the light emitting element.

By allowing GaN to grow on the surface of sapphire substrate while setting the substrate temperature not lower than 800° C., under a degree of vacuum of $10^{-3}$ Pa to $10^{-6}$ Pa, and a ratio of supply of Group-III atom and nitrogen atom to 2 or above, it is made possible to form the high-quality GaN columnar crystals (nano-columns) while keeping anisotropy in the direction of c-axis of the hexagonal system (while suppressing growth in the directions of a-axis and b-axis which correspond to the side faces of the columnar crystals) (see FIG. 5).

In this process, once the growth in a form of columnar crystals starts, the mode of growth of the columnar crystals while keeping anisotropy in the direction of c-axis is sustainable, even in a low temperature region within the substrate temperature range from 600° C. to 950° C.

Figure 9:
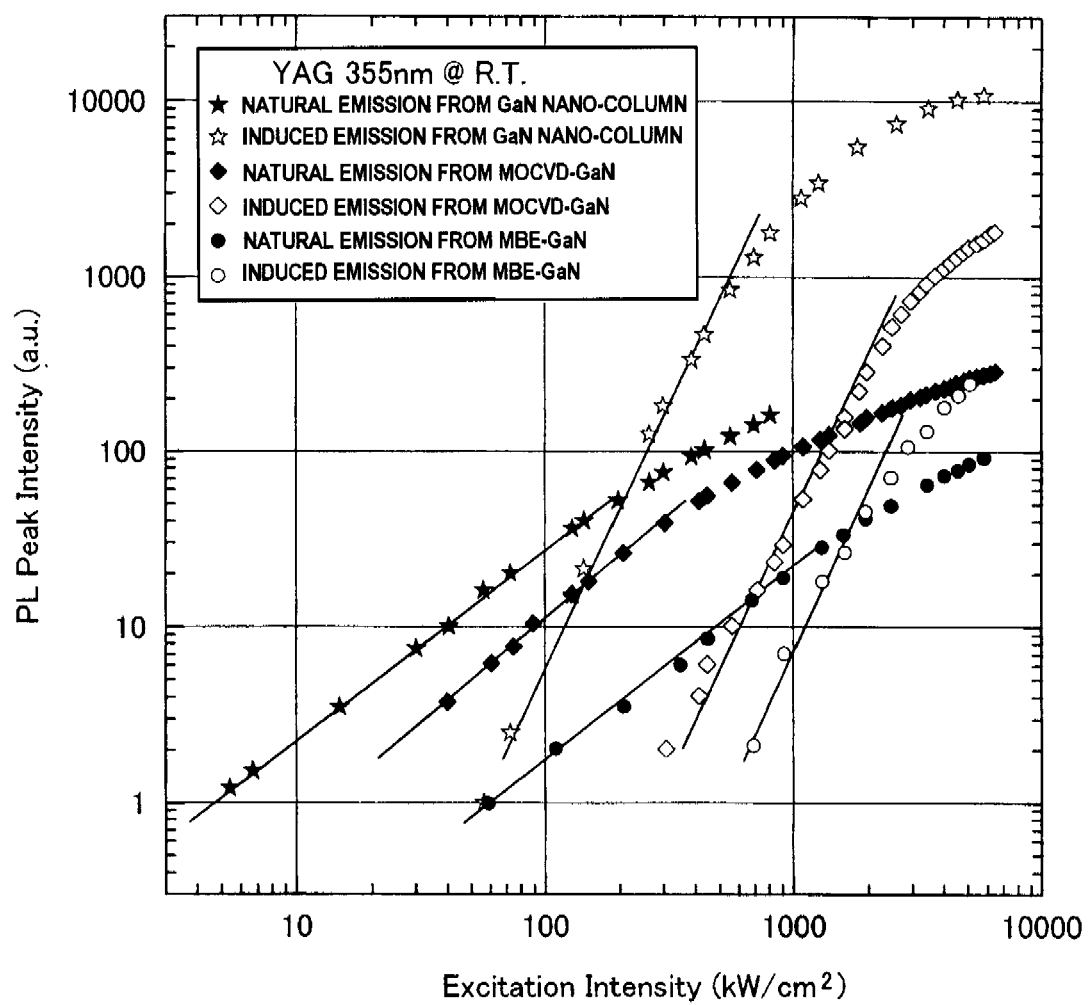
FIG. 9 is a graph showing excitation light intensity dependence of PL peak intensity.

A light-excitation-induced emission experiment using a Nd:YAG pulse laser (wavelength 355 nm, maximum output 20 mJ, pulse width 5 nm) carried out at this timing showed an induced emission at an induction light intensity with an extremely low threshold value, as shown in FIG. 9.

It is also found, as shown in FIG. 9, that the GaN nano-column of the present invention shows a threshold value of intensity of excitation light for induced emission of 0.2 MW/cm², which is decreased about a single order of magnitude below 1.6 MW/cm² shown by MOCVD-GaN, and 2.0 MW/cm² shown by MBE-GaN. Thus, the GaN nano-column of the present invention achieves an excellent induced emission property.

Step S3:

Next, the substrate temperature is adjusted to 860° C. to 880° C. (region B: 750° C. to 950° C.), and under a degree of vacuum of $10^{-3}$ Pa to $10^{-6}$ Pa, Ga and N atoms are supplied under a ratio of supply of 1:2 (region B: 1:2 to 1:100), so as to grow the i-type blocking layer 2d as an i-GaN layer in a form of columnar crystals, as being continued from the above-described GaN:Si cladding layer 2e, to a thickness of 10 nm.

Step S4:

Next, the substrate temperature is adjusted to 500° C. to 800° C., and under a degree of vacuum of $10^{-3}$ Pa to $10^{-6}$ Pa, the light emitting portion 2c having the MQW structure is formed by alternately producing InGaN layers and GaN layers, by repeating multiple number of times a process of forming an InGaN layer to a thickness of 1 nm to 10 nm while adjusting the compositional ratio of In, Ga and N as $In_xGa_{1-x}N$ (x=0 to 0.5), and a process of forming a GaN layer to a thickness of 1 nm to 10 nm while supplying Ga and N atoms at a ratio of (region B: 1:2 to 1:100).

In the above-described MQW structure, not only InGaN/GaN, but also InGaN/InGaN, GaN/AlGaN and InAlGaN/AlGaN and AlGaN/AlGaN are adoptable.

By this process, the light emitting portion 2c is grown as the columnar crystal as being continued from the i-type blocking layer 2d.

Step S5:

Next, the substrate temperature is adjusted to 680° C. to 700° C. (region B: 500° C. to 800° C.), and under a degree of vacuum of $10^{-3}$ Pa to $10^{-6}$ Pa, the i-type blocking layer 2b which is an i-GaN layer is formed, while adjusting the ratio of supply of Ga and N atoms to 1:2 (nitrogen: 1, Ga: 0.5, region B: 1:2 to 1:100), in a form of columnar crystals as being continued from the above-described GaN:Si light emitting portion 2c, to a thickness of 10 nm.

Figure 6:
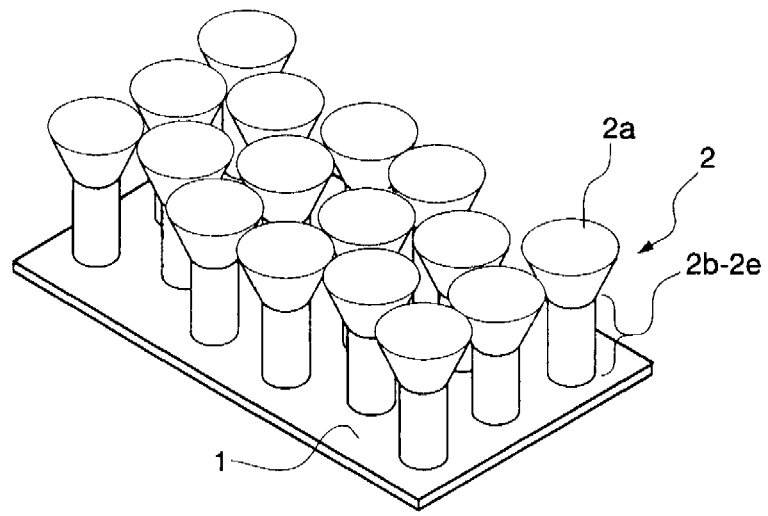
FIG. 6 is a conceptual drawing explaining the method of manufacturing the light emitting element.

Step S6:

Next, the substrate temperature is adjusted to 680° C. to 700° C. (region C: 500° C. to 800° C.), under a degree of vacuum of $10^{-3}$ Pa to $10^{-6}$ Pa, and under supply of Ga and N atoms at a ratio of 1:8 (nitrogen: 1, Ga: 0.125, region C: 1:2 to 1:100), the crystal growth is switched from a mode ensuring anisotropy in the direction of c-axis into a near-isotropic mode of growth, allowing the crystal growth not only in the direction of c-axis of the (0001) surface, but also in the directions normal to the c-axis which correspond to the side faces of the columnar crystal 2 (see FIG. 6).

Figure 7:
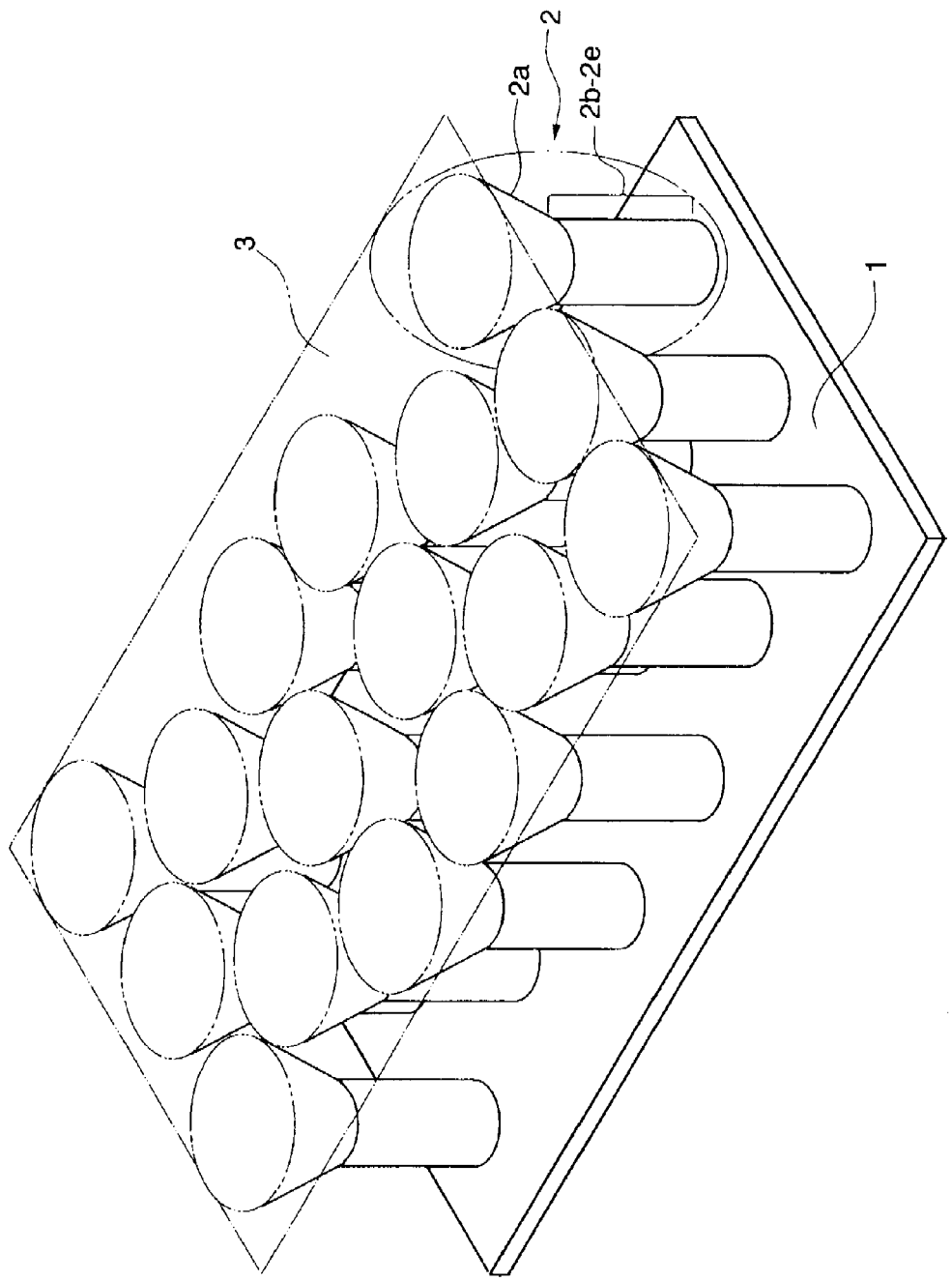
FIG. 7 is a conceptual drawing explaining the method of manufacturing the light emitting element.

By this process, the reverse pyramid portion 2a composing the p-type cladding layer is formed to a height (thickness) of 100 nm to 1,000 nm, as the GaN:Mg columnar crystal 2 (see FIG. 7). In this process, Mg atoms are supplied as p-type impurities at room temperature, so as to attain $p=1\times10^{15}/cm^3$ to $1\times10^{18}/cm^3$.

With progress of the lateral crystal growth of the reverse pyramid portions 2a of the individual columnar crystals 2, the top portions of the reverse pyramid portions 2a (that is, top portions of the columnar crystal 2 including the reverse pyramid portions 2a) are brought into a state of growth while being fused with each other, thereby forming the electrode layer in a form of continuous thin film.

It is to be noted herein that AlGaN is adoptable for the reverse pyramid portion 2a as the p-type cladding layer.

The substrate is finally taken out from the MBE apparatus. A transparent electrode (semitransparent p-type electrode composed of Ti/Al, for example) is formed on the surface of the substrate, and more specifically on the top surface of the electrode layer 3, thereby the light emitting diode is formed. The p-type electrode composed of Ti/Al herein is formed as a stack of two metal films, by depositing Ti of 2 nm thick and then depositing Al of 3 nm thick, by the electron beam deposition process.

Figure 12:
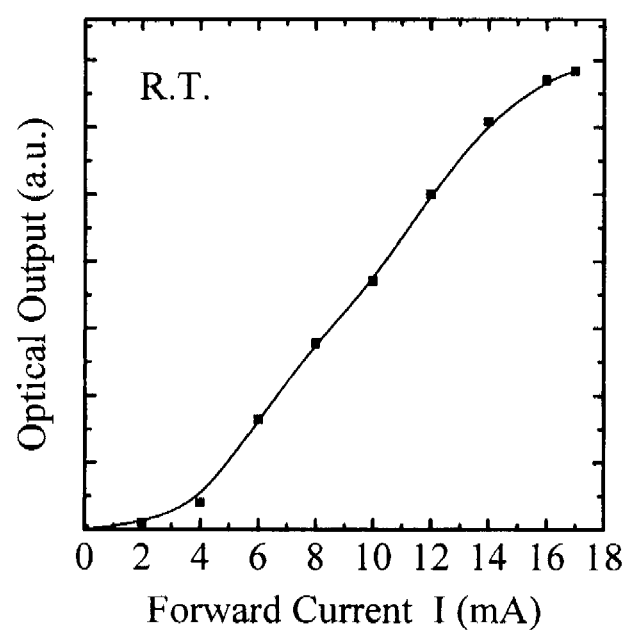
FIG. 12 is a graph showing a light emission characteristic (correlation between current and light output) of a light emitting diode composed of the columnar crystals formed by the present invention.

Characteristics of thus-formed light emitting diode are shown in FIG. 12 (measured at room temperature: R.T.). In FIG. 12, the abscissa corresponds to forward current, and the ordinate corresponds to emission intensity of light induced by the forward current.

Figure 10:
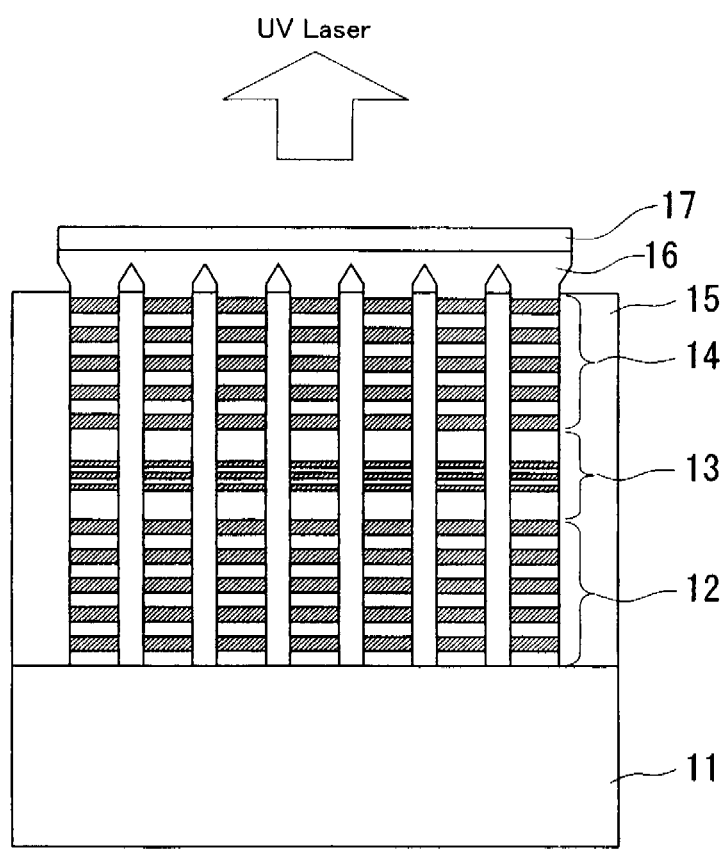
FIG. 10 is a conceptual drawing showing a sectional structure of a semiconductor laser using the columnar crystals of the present invention.
Figure 11:
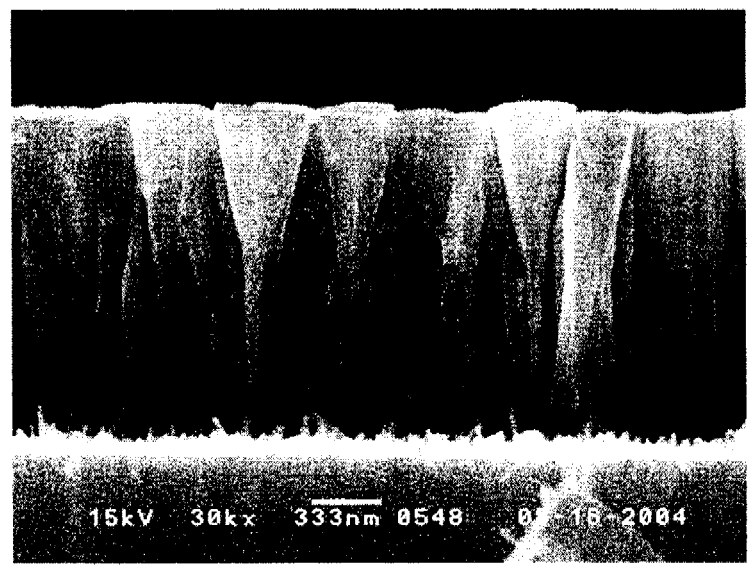
FIG. 11 is a drawing of scanning electron microphotograph showing sections of the columnar crystals formed by Steps S1 to S6 in an embodiment of the present invention.

It is also allowable herein to form the reverse pyramid portion 2a as the p-type cladding layer (under growth conditions similar to those for the n-type cladding layer 2e), while keeping the growth mode of the columnar crystals (the state shown in FIG. 5) unchanged, and to fill with an insulating material such as the above-described dielectric up to a level of height of the columnar crystals, and then to form the transparent electrode as shown in FIG. 10. Also this process can successfully prevent the electrode material to come around.

Methods of filling with the above-described insulating materials such as $SiO_2$, $TiO_2$, $Al_2O_3$, SiN and so forth may be such as, for example, coating a liquid material (particles of an insulating material are suspended in a solvent) such as OCD-T7 ($SiO_2$) from Tokyo Ohka Kogyo Co., Ltd., or an oxide-containing polymer ($TiO_2$,$Al_2O_3$) from Chemat, by the spin coating process, which is followed by annealing so as to allow a desired oxide to deposit between the adjacent columnar crystals.

Besides this, the space between the adjacent columnar crystals can also be filled with a desired oxide ($SiO_2$, $TiO_2$, $Al_2O_3$ and so forth, for example) or a nitride such as SiN, with vapor phase deposition process such as the plasma CVD process.

In the above-described Steps S1 to S5, by raising the ratio of supply of nitrogen as compared with the ratio of supply of the Group-III atom, migration of the Group-III atom (Ga, In, Al and so forth) over the crystal growth surface (or the c-surface) can be suppressed, and the rate of growth in the direction of c-axis is consequently increased as compared with the rate of lateral crystal growth, so that the columnar crystals are prevented from being fused with each other, that is, from forming a continuous film, by being kept in the anisotropic growth mode up to a predetermined level of height.

The growth at high temperatures also successfully removes GaN with nitrogen-polarity, showing a low decomposition temperature, on the sapphire substrate, and allows only growth nuclei with Ga-polarity on AlN dots to grow in a selective manner.

In addition, on the crystal surface normal to the c-axis, which is the side face of the columnar crystal growing in the direction of c-axis, Ga atoms adhered on this side face are destined for re-elimination back into the space, or for rapid migration over the (0001) surface which is the top surface of the columnar crystals, under a condition characterized by high temperature and a less number of atomic adsorption sites of surface orientation.

It is consequently supposed that the GaN columnar crystals grow while keeping anisotropy in the direction of c-axis, and more specifically that the rate of growth in the direction normal to the c-surface (0001) of this hexagonal structure (in the direction of c-axis) is extremely larger than the rate of growth in parallel with the c-surface, and thereby the crystals are grown as the columnar crystals.

Another possibility besides the growth mechanism described in the above is such that Ga metal aggregates on the top surface (c-surface) of the columnar crystals, so as to proceed growth in the vapor-liquid-solid phase (VLS) mode.

On the other hand, Step S6 allows growth of the p-type cladding layer, that is, the reverse pyramid portion 2e (reverse-pyramid-like GaN crystal).

In this process, the reverse pyramid portion 2e is grown by lowering the substrate temperature to as low as 680° C. (500° C. to 800° C.) or around, in contrast to a temperature of 750° C. to 950° C. allowing the GaN columnar crystals to grow in Steps S1 to S5, and by lowering the amount of supply of Ga atom and N atom to 1:4 to 1:100 or around, so as to proceed the growth of GaN crystal under an extremely-nitrogen-excessive condition.

As a consequence, lowering of the substrate temperature as compared with that in the growth of columnar crystals makes the migration of Ga atoms slower, reduces difference between the rate of growth of GaN crystal in parallel with the direction of c-axis (normal to the c-surface) and the rate of growth normal to the direction of c-axis (in parallel with the c-surface), and thereby switches the growth mode of GaN crystal into that allowing the growth also in the direction of the side faces of the columnar crystals.

It is therefore supposed that the diameter of the columnar crystals can gradually increase as the growth proceeds, so as to form the reverse pyramid (reverse pyramid portion) structure.

Another possible cause is ascribable to Mg doping carried out for the purpose of converting the crystal into p-type, wherein the surface of the GaN columnar crystals initially having Ga polarity might be converted to that of nitrogen polarity, resulting in increase in the rate of growth of the columnar crystals in the lateral direction.

<Method of Manufacturing Light Emitting Element; on Sapphire Substrate>

Figure 3:
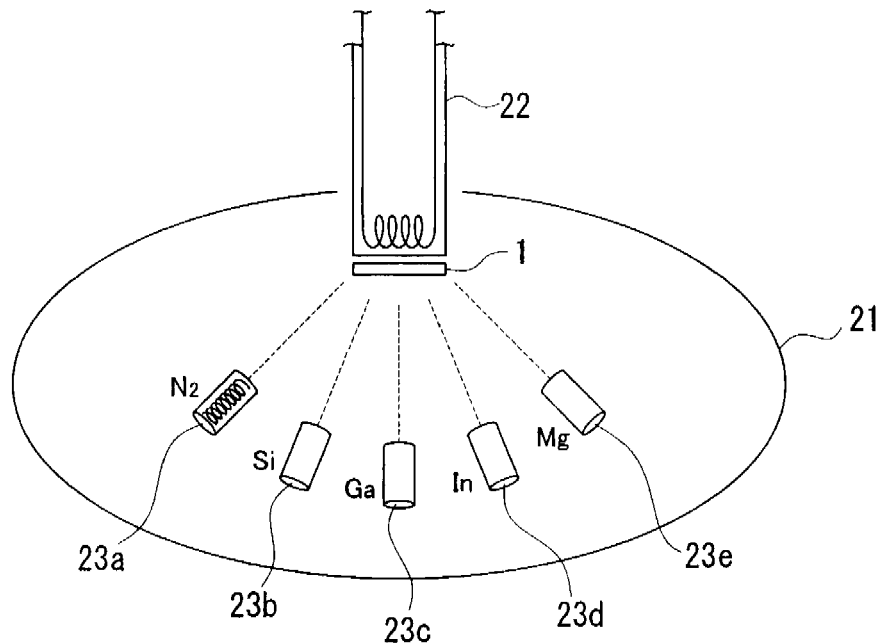
FIG. 3 is a conceptual drawing of an MBE apparatus.

An exemplary case of forming a light emitting diode using a sapphire substrate (on the (0001) surface, with electroconductive finish) as the substrate 1, similarly to as in the production on the Si substrate configured as shown in FIG. 1, will be explained. A manufacturing apparatus adopted herein is, for example, an MBE (molecular beam epitaxy) apparatus shown in FIG. 3. The MBE apparatus has a chamber 21, a heater 22 for heating substrate, and molecular beam irradiation cells 23a, 23b, 23c, 23d and 23e.

The sapphire substrate used herein has Ti deposited from vapor phase to as thick as 350 nm or around, on the back surface thereof (the surface opposite to that allowing thereon the columnar crystal growth).

Prior to the columnar crystal growth, the sapphire substrate is preliminarily subjected to surface treatment using activated N (nitrogen) produced by raising an RF plasma at around 100 W to 450 W in $N_2$ gas supplied at a flow rate of 0.1 to 10 cc/s.

Step S1:

Under conditions expressed by a substrate temperature of 700° C. to 950° C., a degree of vacuum of $10^{-3}$ Pa (in the presence of molecular beam supply) to $10^{-6}$ Pa (in the absence of molecular beam supply), and a ratio of supply of Al and N of 1:1, AlN is grown as a layer of several nanometers thick, or of 1 nm to 20 nm thick. By this process, dots of growth nuclei of AlN can be formed on the sapphire substrate according to a predetermined density, and can thereby grow the columnar crystals with excellent uniformity.

In this process, Al and N atoms migrate over the sapphire substrate, AlN nuclei present within a predetermined range of distance fuse with each other so as to gradually produce nodules. AlN dots 4 of approximately 50 to 100 nm in diameter are formed according to a density of $10^{10}/cm^2$ or around, that is, while keeping predetermined distance therebetween (see FIG. 4). The GaN columnar crystals can be grown with an excellent reproducibility, by allowing GaN to grow using the AlN dots 4 as nuclei in Step S2 and thereafter.

Density of the AlN dots 4 can appropriately be altered, by modifying the above-described conditions.

In Step S2 and thereafter, the columnar crystals are grown similarly to as the growth on the silicon substrate.

Figure 8:
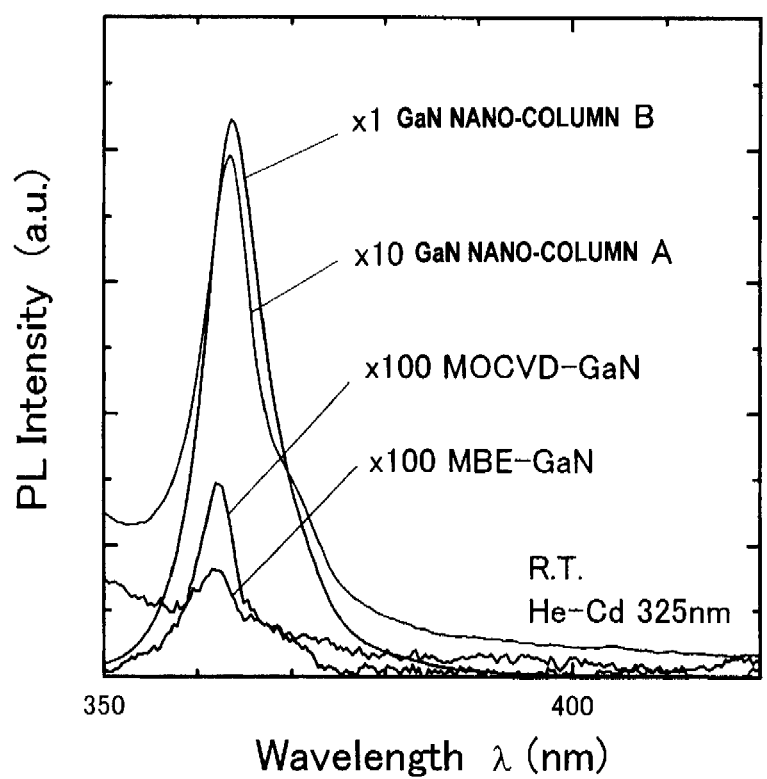
FIG. 8 is a graph showing PL (photo-luminescence) spectra of GaN columnar crystals, a GaN continuous thin film grown by MOCVD, and a GaN continuous thin film grown by MBE.

FIG. 8 shows photo-luminescence (PL) spectra, measured at room temperature, of the GaN columnar crystal grown on the (0001) sapphire substrate by the method of fabrication of the present invention based on the MBE process, a GaN continuous film (with a threading dislocation density of 3 to $5\times10^9/cm^2$) grown by the metal-organic chemical vapor deposition (MOCVD) process, and a GaN continuous film (with a threading dislocation density of approximately $8\times10^9/cm^2$) grown by the MBE process.

An excitation light source used herein for the PL spectrometry is a CW He—Cd laser having an emission wavelength of 325 nm and an intensity of 10 mW.

The diameter of the columnar crystals herein is 50 nm to 100 nm.

It was confirmed from FIG. 8 that, assuming the emission peak intensity of GaN grown by MOCVD as 1, GaN formed by the MBE process showed an intensity of 0.3, whereas the GaN columnar crystals grown by the MBE process of the present invention showed extremely strong emission expressed by intensities of 27 (nano-column A) to 286 (nano-column B).

One possible method of forming dots (AlN dots or GaN dots), which can serve as the nuclei on the surface of the sapphire substrate and the silicon substrate, periodically at predetermined intervals (according to a predetermined density) is such as using a $SiO_2$ film or a Ti film as a mask, in other words, forming holes in the $SiO_2$ film or in the Ti film where the growth is desired to proceed, so as to make the surface of the substrate expose therein, thereby allowing the columnar crystals to grow on the exposed portions.

Still another method is possibly such as modifying (for example, scratching) the surface of the substrate by irradiating electron beam or Ga beam at a predetermined energy, specifically in portions where the columnar crystals are desired to grow, and making use of the modified surface as the nuclei for growth of the dots.

The portions where the columnar crystals are desired to grow may be irradiated with electron beam at a predetermined energy.

By this process, carbon deposits where the electron beam is irradiated, and thus deposited carbon can be used as a marking for growth of the dots.

In addition, it is also allowable to design an atomic step structure of the substrate on the wafer scale, aiming at aligning micro-structures using such step structure as a template, and to form the columnar crystals as being grown on the nuclei, making use of selectivity of nuclei formation between the terrace and the step band.

It is still also allowable to use a silicon super-precision die or the like, wherein an irregular geometry is formed directly on the surface of the substrate specifically in the portion destined for growth of the columnar crystals, by the nano/micro-imprinting technique, so as to form a periodic structure.

By fabrication according to the above-described methods of manufacturing, a high-quality GaN crystal almost free from threading dislocation can readily be grown, and consequently hetero junction or p-n junction can readily be formed in a continuous manner in the process of growth of the columnar crystals.

In the process of forming the hetero junction, even growth of the hetero structure largely differing in the lattice constants and in the thermal expansion coefficients can largely reduce distortion stress, as compared with the continuous film, by virtue of the columnar crystal structure, and can thereby prevent cracks from occurring.

According to the above-described method of manufacturing, it is also expected to improve the efficiency of light emitting diodes (LED) or photo-excitation elements in which the columnar crystals are used, because the growth surface (that is, the top portion) of the columnar crystal will have a nano-texture (surface nano-structure, or fine irregular geometry on the surface) in a self-organized manner, and this structure can contribute to large efficiencies in extraction and introduction of light.

Besides the above-described substrate materials, also the (0001) surface of SiC, metals (Al, Ti, Fe, Ni, Cu, Mo, Pd, Ag, Ta, W, Pt, Au, or alloys partially containing these elements), and flat substrate obtained by coating any of these metals on a predetermined substrate (for example, the Si (111) surface of Si substrate) can be used as the substrate allowing thereon growth of the GaN crystal, that is, the columnar crystals of the Group-III nitride semiconductor.

In the above-described method of manufacturing, Mg used as a p-type dopant (impurity) in the process of forming the p-type cladding layer may be replaced with Be.

It is still also allowable to simultaneously dope Be and Si, or Be and O, in place of Mg, so as to form the p-type cladding layer.

The present invention is aimed at providing light emitting elements operating at a wavelength band from 200 nm (AlN) to 800 nm (GaInN). In nitride-base semiconductors, as materials for the columnar crystals and the light emitting layer, InGaN, GaN, AlGaInN, AlGaN, AlN and hetero-structures composed of these materials may be employed.

As other possible materials for the columnar crystals and the light emitting layer in oxide-base semiconductors, ZnO, CdZnO, MgZnO, MgZnCdO and hetero-structures composed of these materials may be employed.

For the case where the substrate 1 has an insulating property, it is also allowable to remove the substrate 1 by laser lift-off or etching, and to form an electrode on the bottom portion of the n-type cladding layer 2e of each columnar crystal 2, or to transfer (transplant) the columnar crystals onto another electro-conductive substrate.

The columnar crystals formed by the above-described method of manufacturing are periodically arranged, while keeping voids between the adjacent columnar crystals.

For the purpose of improving physical strength of the element structure, an insulating material may therefore be filled as a support material into the space between the adjacent columnar crystals.

The filling component used herein may be $SiO_2$, $Al_2O_3$, $TiO_2$, $ZrO_2$, $Gd_2O_3$, polyimide, epoxy resin or the like.

For the case where the substrate 1 has an insulating property, it is also allowable to remove the substrate 1 by laser lift-off or etching, to carry out filling with the above-described support material (insulating filling material), and to form an electrode on the bottom portion of the n-type cladding layer 2e of each columnar crystal 2, or to transfer (transplant) the columnar crystals onto another electro-conductive substrate.

<Structure of Semiconductor Laser>

Next, a configuration of a semiconductor laser element obtained by adopting the columnar crystals used in the above-described light emitting diode and the method of manufacturing will be explained, referring to FIG. 10 showing a section of the structure.

The semiconductor laser element has, on the substrate 11 composed of an electro-conductive material (Si (111) surface, or the SiC (0001) surface), a plurality of columnar crystals having a device structure (light emitting function, or light- and electron-confining function) individually based on a quantum structure composed of an n-AlGaN DBR 12 (distributed Bragg reflector layer), an active layer composed of AlGaN MQW 13 (multiple quantum well), and a p-AlGaN DBR 14 or the like, arranged according to a predetermined periodicity, wherein the space between every adjacent columnar crystals is filled with a transmissive insulating material 15 ($SiO_2$, for example).

It is also allowable, as in Step S6 described previously, to grow the entire portions of the columnar crystals, while keeping the growth mode of the columnar crystals (the state shown in FIG. 5) unchanged, to fill with the insulating material composed of a dielectric, up to a level of height of the columnar crystals, and then to form the electrode material on the surface thereof. Also this process can successfully prevent the electrode material from coming around.

Another possible structure is shown in FIG. 10, in which an electrode 17 composed of a transmissive material is formed on a continuous film 16, formed by bonding the top surfaces of the reverse pyramid portions of the columnar crystals, while allowing the crystal growth to proceed in the isotropic mode. In one possible method of forming a p-side reflective mirror, the p-type continuous film 16 may directly be formed, while omitting the p-AlGaN DBR 14, but forming the semiconductor DBR in such continuous film, or a reflective mirror composed of a dielectric multi-layered film may be formed.

By virtue of arrangement of the columnar crystals neighboring within a predetermined distance, supply of a predetermined current between the upper and lower electrodes can initiate light emission in the active layers of the individual columnar crystals, wherein also a predetermined intensity of light emitted from the active layers of the adjacent columnar crystals comes therein to thereby raise induced emission, and finally results in laser oscillation after phases of the emitted light from the individual columnar crystals are synchronized.

Similarly to the light emitting diode described previously, the above-described semiconductor laser element of the present invention is improved in the light emission property as compared with the conventional one, by virtue of the crystals almost free from threading dislocation, and is simplified in formation of the upper electrode 17, because the columnar crystals are sequentially transformed from reverse cone or reverse polygonal pyramid geometry of the reverse pyramid portions thereof, so as to finally give the continuous film 16 on the upper portions thereof.

In the foregoing explanations, the columnar crystals are grown by using a molecular beam epitaxy (MBE) apparatus, whereas the light emitting element making use of the above-descried columnar crystals can be formed also by MOCVD, HVPE or sputtering, by appropriately controlling the substrate temperature and the ratio of supply of Group-V/III.

The foregoing paragraphs have explained the present invention referring to a light emitting diode and a semiconductor laser, whereas the present invention is applicable, not only to these light emitting devices, but also to semiconductor devices having any other diode structures (device structures having rectifying function).

INDUSTRIAL APPLICABILITY

According to the present invention, by forming the columnar crystals of nitride-base compound semiconductor, and by providing the light emitting portion to each of the columnar crystals, it is possible to obtain semiconductor devices such as light emitting elements having high luminance in short-wavelength emission region, making an effective use of properties of the high-quality columnar crystals almost free from threading dislocation density. In addition, the electrode material is successfully prevented from coming around the side faces of the columnar crystals, thereby simplifying formation of the electrode in the process steps of manufacturing light emitting elements.

The invention claimed is:

1. A semiconductor element comprising:
    a substrate;
    a plurality of columnar crystals arranged on said substrate according to a predetermined density, and in which a device structure is formed;
    wherein each of the plurality of columnar crystals comprises an n-type cladding layer, an i-type blocking layer, a light emitting layer, and a p-type cladding layer arranged in this order from the substrate, or each of the plurality of columnar crystals comprises an n-type cladding layer, a light emitting layer, an i-type blocking layer, and a p-type cladding layer arranged in this order from the substrate,
    wherein a material of the p-type cladding layer comprises p-GaN:Mg or p-AlGaN:Mg, a material of the i-type blocking layer comprises intrinsic GaN, a material of the n-type cladding layer comprises n-GaN:Si or n-AlGaN:Si, and the light emitting layer has a single-quantum well structure comprising $In_xGa_{1-x}N/In_yGa_{1-y}N$ or $Al_xGa_{1-x}N/Al_yGa_{1-y}N$ or a multiple-quantum well structure comprising multiple alternating layers comprising $In_xGa_{1-x}N/In_yGa_{1-y}N$ or $Al_xGa_{1-x}N/Al_yGa_{1-y}N$; and
    wherein the p-type cladding layer has a truncated reverse cone shape; wherein upper surfaces of the p-type cladding layers are fused together to form a two-dimensionally continuous thin film layer.

2. The semiconductor element as claimed in claim 1, having a filling component composed of a dielectric material between adjacent columnar crystals.

3. The semiconductor element as claimed in claim 1, wherein each of the plurality of columnar crystals comprises an n-type cladding layer, an i-type blocking layer, a light emitting layer, and a p-type cladding layer arranged in this order from the substrate.

4. The semiconductor element as claimed in claim 1, wherein x is 0 to 0.5.

5. A semiconductor element comprising:
a substrate;
a plurality of columnar crystals arranged on said substrate according to a predetermined density, and in which a device structure is formed;
wherein each of the plurality of columnar crystals comprises an n-type cladding layer, an i-type blocking layer, a light emitting layer, and a p-type cladding layer arranged in this order from the substrate, or each of the plurality of columnar crystals comprises an n-type cladding layer, a light emitting layer, an i-type blocking layer, and a p-type cladding layer arranged in this order from the substrate, wherein a material of the p-type cladding layer comprises p-GaN:Mg or p-AlGaN:Mg, a material of the i-type blocking layer comprises intrinsic GaN, a material of the n-type cladding layer comprises n-GaN:Si or n-AlGaN:Si, and the light emitting layer has a single-quantum well structure comprising $In_xGa_{1-x}N/In_yGa_{1-y}N$ or $Al_xGa_{1-x}N/Al_yGa_{1-y}N$ or a multiple-quantum well structure comprising multiple alternating layers comprising $In_xGa_{1-x}N/In_yGa_{1-y}N$ or $Al_xGa_{1-x}N/Al_yGa_{1-y}N$, wherein upper surfaces of the p-type cladding layers of the plurality of the columnar crystals are fused together to form a two-dimensionally continuous film layer; and wherein each p-type cladding layer is gradually enlarged in a direction of c-axis, from a diameter of said columnar crystals to form a truncated reverse cone shape.

* * * * *